US 8,344,343 B2

(12) United States Patent
Yeh et al.

(10) Patent No.: US 8,344,343 B2
(45) Date of Patent: Jan. 1, 2013

(54) COMPOSITE FILM FOR PHASE CHANGE MEMORY DEVICES

(75) Inventors: Tung-Ti Yeh, Tainan (TW); Neng-Kuo Chen, Sinshih Township (TW); Cheng-Yuan Tsai, Chu-Pei (TW); Chung-Yi Yu, Hsinchu (TW); Chia-Shiung Tsai, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 170 days.

(21) Appl. No.: 12/750,323

(22) Filed: Mar. 30, 2010

(65) Prior Publication Data

US 2010/0252794 A1    Oct. 7, 2010

Related U.S. Application Data

(60) Provisional application No. 61/165,773, filed on Apr. 1, 2009.

(51) Int. Cl.
*H01L 29/04* (2006.01)
*H01L 29/02* (2006.01)
*H01L 47/00* (2006.01)
*H01L 21/06* (2006.01)

(52) U.S. Cl. . 257/2; 257/3; 257/E21.068; 257/E45.001; 438/102

(58) Field of Classification Search ............... 438/102; 257/42
See application file for complete search history.

(56) References Cited

U.S. PATENT DOCUMENTS

2007/0170413 A1* 7/2007 Matsui et al. .............. 257/3
2010/0213431 A1* 8/2010 Yeh et al. .................. 257/2

* cited by examiner

*Primary Examiner* — Fernando L Toledo
*Assistant Examiner* — Valerie N Brown
(74) *Attorney, Agent, or Firm* — Lowe Hauptman Ham & Berner, LLP

(57) ABSTRACT

A phase change memory device and a method of manufacture are provided. The phase change memory device includes a phase change layer electrically coupled to a top electrode and a bottom electrode, the phase change layer comprising a phase change material. A mask layer is formed overlying the phase change layer. A first sealing layer is formed overlying the mask layer, and a second sealing layer is formed overlying the first sealing layer.

19 Claims, 3 Drawing Sheets

COMPOSITE FILM FOR PHASE CHANGE MEMORY DEVICES

CROSS-REFERENCE TO RELATED APPLICATIONS

The present application claims priority of U.S. Provisional Patent Application Ser. No. 61/165,773, filed on Apr. 1, 2009, which is incorporated herein by reference in its entirety.

BACKGROUND

The present invention relates generally to phase change memory devices and, more particularly, to composite films for phase change memory devices.

Phase change technology is promising for next generation memory devices. It uses chalcogenide semiconductors for storing states and digital information. The chalcogenide semiconductors, also called phase change materials, have a crystalline state and an amorphous state. In the crystalline state, the phase change materials have low resistivity; while in the amorphous state, they have high resistivity. The resistivity ratios of the phase change materials in the amorphous and crystalline states are typically greater than 1000:1, and thus the phase change memory devices are unlikely to have errors for reading states. The chalcogenide semiconductors are stable at a certain temperature range in both crystalline and amorphous states and can be switched back and forth between the two states by electric pulses.

Typically, a phase change memory device is formed by placing a phase change material between two electrodes. Write operations, also called programming operations, which apply electric pulses to the memory device, and read operations, which measure the resistance of the phase change memory, are performed through the two electrodes. Generally, write operations utilize a set pulse and a reset pulse. The set pulse heats the phase change material to a temperature higher than a crystallization temperature, but below a melting temperature, for a time longer than the required crystalline time, for the crystallization to take place. The reset pulse, which turns the phase change material into an amorphous state, heats the phase change material to a temperature higher than the melting temperature. The temperature is then quickly dropped below the crystallization temperature for a time period short enough to reduce or prevent the crystallization. The phase change material is heated by controlling the current flowing through a conductive material, commonly referred to as a "heater." The heater comprises a conductive material that, due to its resistive properties, heats up when a sufficiently high voltage differential is applied.

A protective layer is often placed over the chalcogenide material to protect the material and to protect surrounding material from damage caused by changing the state of the chalcogenide material. This protective layer may be formed by a high temperature or a low temperature process. In the high temperature process, however temperatures typically exceeding about 300° C. may cause the underlying chalcogenide material to outgass. This outgassing causes cracks or voids to develop at the interface between the chalcogenide material and the protective layer leading to device failure. On the other hand, in the low temperature process, the resultant protective layer formed over the chalcogenide material may result in poor film conformity leading, again to the development of cracks or voids at the interface between the chalcogenide material and the protective layer.

For these reasons and other reasons that will become apparent upon reading the following detailed description, there is a need for an improved phase change memory device and a method of manufacture that avoids the formation of cracks/voids associated with conventional methods.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

Figure 1:
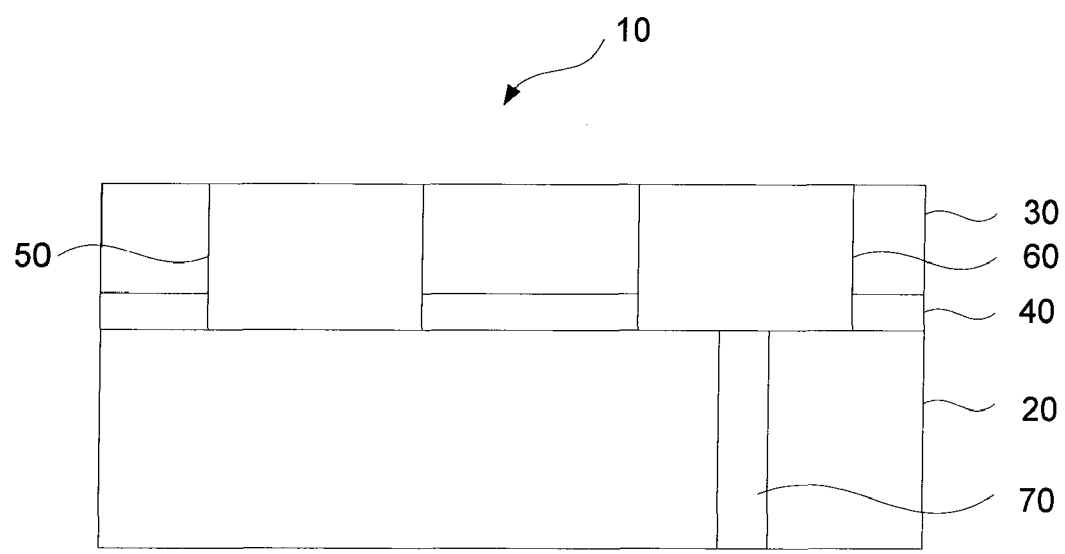
FIGS. 1-5 illustrate a method of forming a phase change memory device in accordance with one embodiment of the present invention.

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

The intermediate stages of manufacturing a novel phase change device embodiment of the present invention are illustrated in FIGS. 1-5. Embodiments of the present invention may be particularly useful in creating phase change memory (PCM) devices. Other embodiments of the present invention, however, may be used in other types of devices. Throughout the various views and illustrative embodiments of the present invention, like reference numerals are used to designate like elements.

Referring first to FIG. 1, a portion of a wafer 10 is shown having a first dielectric layer 20 and a second dielectric layer 30 in accordance with an embodiment of the present invention. The first dielectric layer 20 and the second dielectric layer 30 may be, for example, one or more inter-layer dielectric (ILD) layers and/or inter-metal dielectric (IMD) layers. Generally, the ILD and IMD layers and the associated metallization layers are used to interconnect electrical circuitry (not shown) formed on an underlying substrate (not shown) to each other and to provide an external electrical connection.

The first dielectric layer 20 and the second dielectric layer 30 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). It should be noted that each of the first dielectric layer 20 and the second dielectric layer 30 may comprise a plurality of dielectric layers.

It should also be understood that one or more etch stop layers, such as etch stop layer 40, may be positioned between adjacent ones of the dielectric layers, e.g., between the first dielectric layer 20 and the second dielectric layer 30 as illustrated in FIG. 1. Generally, the etch stop layers provide a mechanism to stop an etching process when forming vias, contacts, or in this case, electrodes. The etch stop layers may be formed of a dielectric material having a different etch selectivity from adjacent layers. In an embodiment, etch stop layers may be formed of SiN, SiCN, SiCO, CN, combinations thereof, or the like, deposited by CVD or PECVD techniques.

A top electrode 50 and a bottom electrode 60 are formed in the second dielectric layer 30. It should be understood that the top electrode 50 and the bottom electrode 60 may be electrically coupled to electronic circuitry (not shown) formed on an underlying substrate (not shown) and/or to an external connection (not shown). The circuitry formed on the substrate may be any type of circuitry suitable for a particular application, such as an access transistor for reading the state of the phase change material and/or changing the state of the phase change material. In an embodiment, the circuitry includes electronic devices formed on the substrate with one or more dielectric layers overlying the electronic devices. Metal layers may be formed between dielectric layers to route electrical signals between the electronic devices. Electrical devices may also be formed in the one or more dielectric layers.

The circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

For example, in the embodiment illustrated in FIG. 1, the bottom electrode 60 may be electrically coupled to source/drain regions of a transistor formed on an underlying substrate by a contact 70. In this manner, the transistor may be used to control the setting and resetting of the phase change material (to be formed in a subsequent step) and/or reading the state of the phase change material.

The top electrode 50 and the bottom electrode 60 may be formed in the second dielectric layer 30 by any suitable process, including photolithography and etching techniques. Generally, photolithography techniques involve depositing a photoresist material, which is masked, exposed, and developed to expose portions of the second dielectric layer 30 that are to be removed. The remaining photoresist material protects the underlying material from subsequent processing steps, such as etching. In an embodiment, photoresist material is utilized to create a patterned mask to define the top electrode 50 and the bottom electrode 60. Openings may be formed using an etching process such as an anisotropic or isotropic etch process, such as an anisotropic dry etch process. After the etching process, any remaining photoresist material may be removed, and thereafter, the openings may be filled with a conductive material. Processes that may be used to form the top electrode 50 and the bottom electrode 60 include single and dual damascene processes.

The top electrode 50 and the bottom electrode 60 may be formed of any suitable conductive material, such as a highly-conductive, low-resistive metal, elemental metal, transition metal, or the like, including metals or metal alloys including one or more of Al, AlCu, Cu, Ti, TiN, W, and the like. Furthermore, the top electrode 50 and the bottom electrode 60 may include a barrier/adhesion layer to prevent diffusion and provide better adhesion between the top electrode 50/the bottom electrode 60 and the surrounding dielectric layers.

The top electrode 50 and the bottom electrode 60 may be formed, for example, by physical vapor deposition (PVD), atomic layer deposition (ALD), spin-on deposition, or other suitable methods. A chemical-mechanical polishing (CMP) process may be performed to remove excess conductive material and to planarize the surface of the second dielectric layer 30 and the top electrode 50 and the bottom electrode 60.

Figure 2:
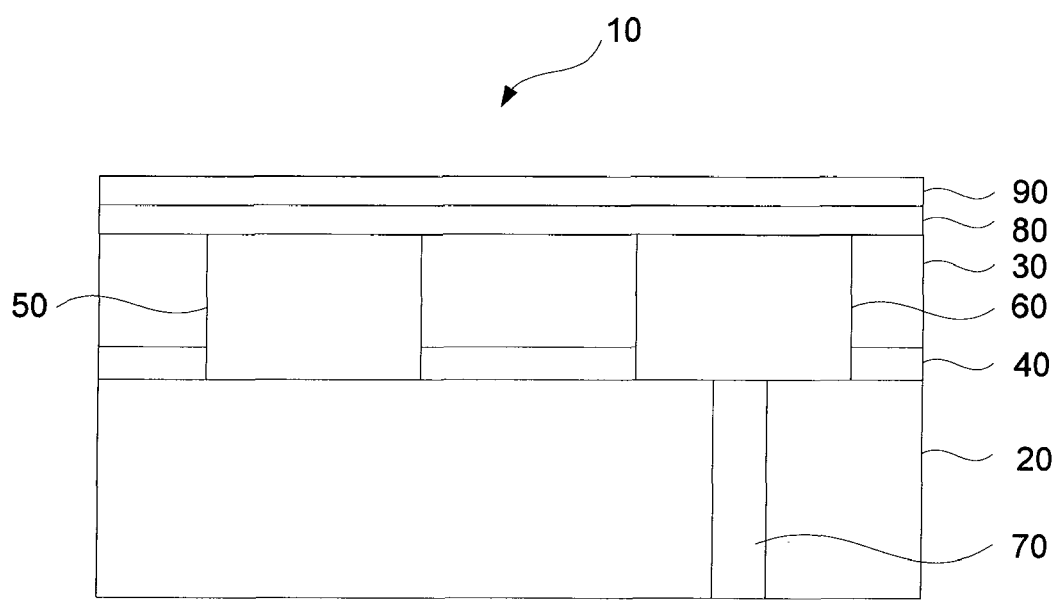

FIG. 2 illustrates formation of a phase change layer 80 in accordance with an embodiment of the present invention. In an embodiment, the phase change layer 80 comprises chalcogenide materials, such as $Ge_xSb_yTe_z$, wherein x, y, and z indicate the ratio of the respective elements. For example, the phase change layer may be formed of $Ge_1Sb_4Te_7$, $Ge_2Sb_2Te_5$, $Ge_1Sb_2Te_4$, or the like. Other materials, such as eutectic $Sb_{69}Te_{31}+M$, where M is Ag, In, Ge, Sn, or the like, may also be used. In an embodiment, the phase change layer 80 has a thickness of between about 1 nm and about 100 nm, such as between about 5 nm and about 30 nm. The ratio of amorphous resistivity and crystalline resistivity of the phase change layer 80 can be as high as 5 orders, although the ratio may be lower. In an exemplary embodiment, the resistivity of the phase change layer 80 in the amorphous state is between about 1 $\Omega \cdot cm$ and about 1E2 $\Omega \cdot cm$, and the resistivity of the same material in the crystalline state is between about 1E-5 $\Omega \cdot cm$ and about 5E-3 $\Omega \cdot cm$. In alternative embodiments, phase change materials that can be symbolized as $Ge_xSb_yTe_zM$ are used, wherein M is a material selected from Ag, Sn, In, and combinations thereof.

Also shown in FIG. 2 is a mask or protective layer 90 formed over the phase change layer 80. The protective layer 90 provides protection to the overlying materials from the heating of the phase change layer, as well as provides a mask layer during subsequent processing. In an embodiment, the protective layer 90 is a multi-layered mask comprising layers of a nitride layer and an oxide layer. The nitride layer may be a silicon nitride ($Si_3N_4$) layer formed on top of the oxide layer. The $Si_3N_4$ layer may be formed using CVD techniques using silane and ammonia as precursor gases, and deposition temperatures ranging from about 100° C. to about 900° C. The oxide layer may be a silicon dioxide layer formed by thermal oxidation or by chemical vapor deposition (CVD) techniques using tetraethylorthosilicate (TEOS) and oxygen as precursor. Another nitride layer, such as a silicon oxynitride layer may be formed over the oxide layer. Other types of masks or protective layers, including single-layer masks or multi-layer masks, using the same or other materials may also be used.

Figure 3:
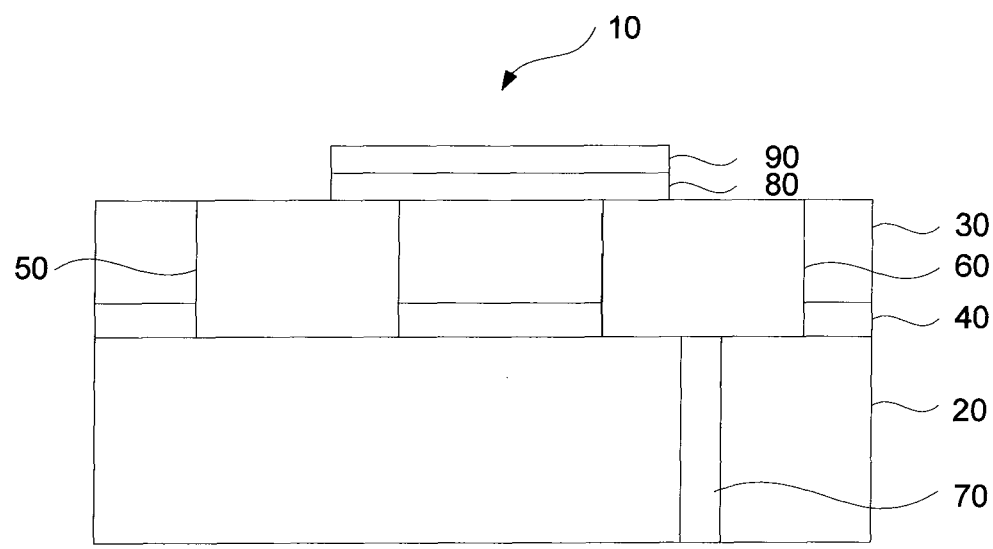

FIG. 3 shows the phase change layer 80 and the protective layer 90 after patterning and etching steps. Generally, the phase change layer 80 and the protective layer 90 may be patterned using photolithography techniques such that the phase change layer 80 overlies at least portions of the top electrode 50 and the bottom electrode 60. In this manner, the state of the phase change layer 80 may be controlled and read by placing a voltage differential between the top electrode 50 and the bottom electrode 60. The current flowing through the material of the phase change layer 80 and the resistive properties cause the material of the phase change layer 80 to heat, thereby allowing the material of the phase change layer 80 to be placed in a crystalline state or an amorphous state. The state of the phase change layer 80 may be determined by placing a voltage differential between the top electrode 50 and the bottom electrode 60 and measuring the resistance therebetween.

Figure 4:
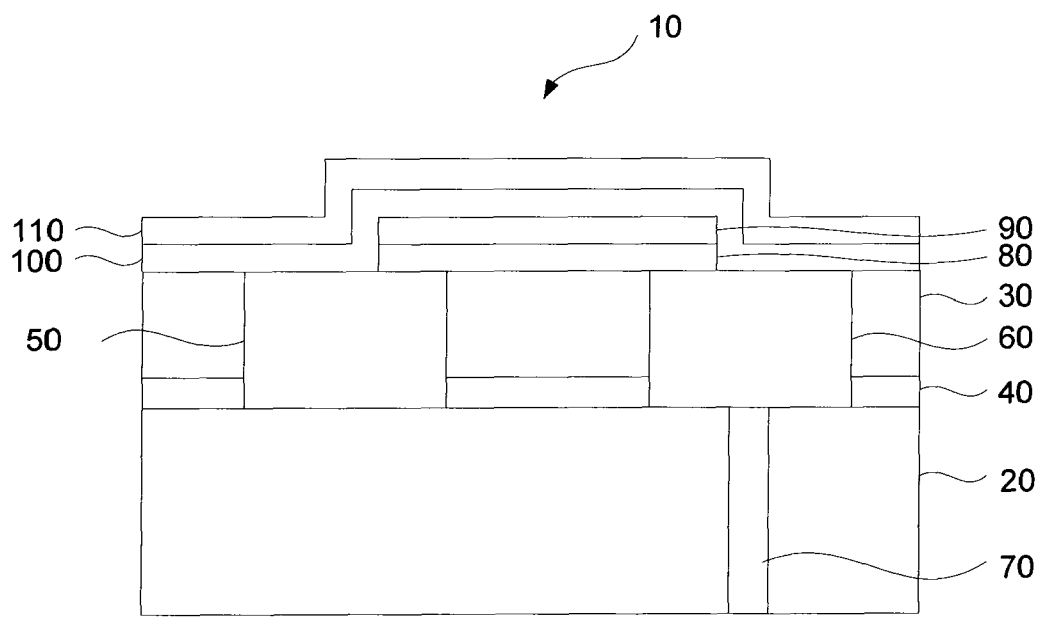

Thereafter, a first sealing layer 100 and a second sealing layer 110 may be formed in accordance with an embodiment of the present invention as illustrated in FIG. 4. The first sealing layer 100 is formed over the protective layer 90 and portions of the phase change layer 80. The first sealing layer 100 may be formed of, for example, silicon nitride, silicon oxide, silicon oxynitride or other material having a different etch rate than the surrounding materials to a thickness of from about 10 angstroms to about 1,000 angstroms. In one embodiment, the first sealing layer 100 is formed at a temperature of from about 20° C. to about 300° C. and for a duration of from about 1 second to about 1000 seconds. In some embodiments, the first sealing layer 100 is formed at a temperature of from about 50° C. to about 200° C. and for a duration of from about 1 second to about 500 seconds. It is understood that the formation of the first sealing layer 100 at a low temperature below about 300° C. (300° C. is the temperature at about which chalcogenide material outgasses) reduces the tendency of the underlying phase change layer 80 containing the chalcogenide material from outgassing causing cracks or voids to develop at the interface between the phase change layer 80 and the first sealing layer 100.

Following the formation of the first sealing layer 100, a second sealing layer 110 is formed overlying the first sealing layer 100 according to one embodiment of the present invention. The second sealing layer 110 may be formed of silicon nitride, silicon oxide, and silicon oxynitride to a thickness of from about 10 angstroms to about 1,000 angstroms. In one embodiment, the second sealing layer 110 is formed at a temperature of from about 20° C. to about 1,000° C. and for a duration of from about 1 second to about 1,000 seconds. In some embodiments, the second sealing layer 100 is formed at a temperature of from about 50° C. to about 800° C. and for a duration of from about 1 second to about 50 seconds. Formation of the second sealing layer 110 at a higher temperature than the first sealing layer 100 provides for better film conformity and gap fill leading to improved device performance.

Figure 5:
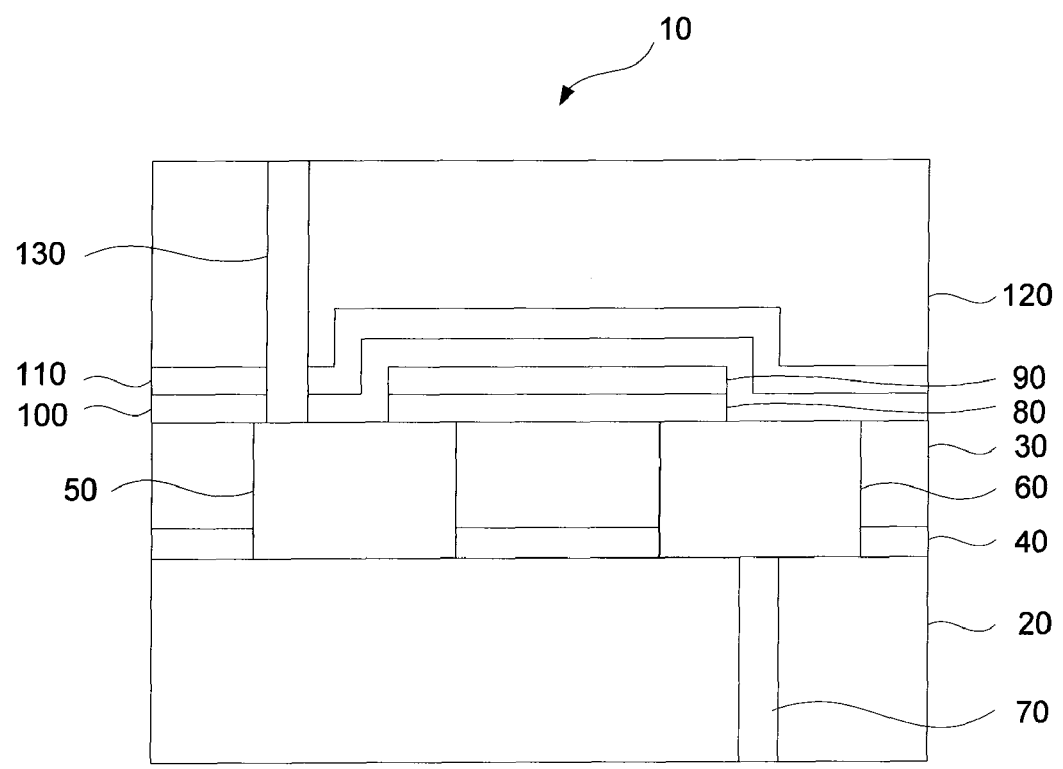

As shown in FIG. 5, a third dielectric layer 120 may be formed using similar processes and materials as the first dielectric layer 20 and the second dielectric layer 30 discussed above, although it is desirable that materials other than oxygen be used to prevent oxidation of the phase change layer 80. Also shown in FIG. 5 is a contact 130 to the top electrode 50. The contact 130 provides an electrical connection between the top electrode 50 and other circuitry and/or an external contact. The contact 130 may be formed of a conductive material such as metals or metal alloys including one or more of Al, AlCu, Cu, Ti, TiN, W, and the like, using damascene processes.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A semiconductor device, comprising:
   a substrate having one or more dielectric layers formed thereon;
   a top electrode and a bottom electrode in the one or more dielectric layers;
   a phase change layer overlying the one or more dielectric layers and electrically coupled to the top electrode and the bottom electrode, the phase change layer comprising a phase change material;
   a mask layer overlying the phase change layer;
   a first sealing layer overlying the mask layer; and
   a second sealing layer overlying the first sealing layer;
   wherein the phase change layer overlies at least a portion of the top electrode and the bottom electrode.

2. The semiconductor device of claim 1, wherein the phase change material comprises a chalcogenide material.

3. The semiconductor device of claim 1, wherein the phase change layer material comprises $Ge_1Sb_4Te_7$, $Ge_2Sb_2Te_5$, $Ge_1Sb_2Te_4$, or eutectic $Sb_{69}Te_{31}$+M, where M is Ag, In, Ge, or Sn.

4. The semiconductor device of claim 1, wherein the mask layer comprises silicon nitride.

5. The semiconductor device of claim 1, wherein the first sealing layer has a thickness of from about 10 angstroms to about 1,000 angstroms.

6. The semiconductor device of claim 1, wherein the second sealing layer has a thickness of from about 10 angstroms to about 1,000 angstroms and comprises a material selected from the group consisting of silicon nitride, silicon oxide and SiON.

7. A method of forming a semiconductor device, the method comprising:
   providing a substrate having one or more dielectric layers formed thereon;
   forming a phase change layer over the one or more dielectric layers;
   forming a mask layer over the phase change layer;
   forming a first sealing layer overlying the mask layer; and
   forming a second sealing layer overlying the first sealing layer;
   the method further comprising forming a top electrode and a bottom electrode in the one or more dielectric layers, wherein the phase change layer overlies at least a portion of the top electrode and the bottom electrode.

8. The method of claim 7, wherein
   the first sealing layer is formed at a first temperature lower than a temperature at which the phase change layer outgases; and
   the second sealing layer is formed at a second temperature higher than the first temperature at which the first sealing layer is formed.

9. The method of claim 7, wherein the phase change material comprises a chalcogenide material.

10. The method of claim 7, wherein the phase change layer material comprises $Ge_1Sb_4Te_7$, $Ge_2Sb_2Te_5$, $Ge_1Sb_2Te_4$, or eutectic $Sb_{69}Te_{31}$+M, where M is Ag, In, Ge, or Sn.

11. The method of claim 7, wherein the mask layer comprises silicon nitride.

12. The method of claim 7, wherein the first sealing layer has a thickness of from about 10 angstroms to about 1,000 angstroms and comprises a material selected from the group consisting of silicon oxide, and SiON.

13. The method of claim 7, wherein the second sealing layer has a thickness of from about 10 angstroms to about 1,000 angstroms and comprises a material selected from the group consisting of silicon nitride, silicon oxide, and SiON.

14. The method of claim 7, wherein the first sealing layer is formed at the first temperature of from about 20° C. to about 300° C., and for a duration of from about 1 second to about 1,000 seconds.

15. The method of claim 14, wherein the second sealing layer is formed at the second temperature of from about 20° C. to about 1,000° C., and for a duration of from about 1 second to about 1,000 seconds.

16. The method of claim 7, wherein the phase change layer overlies only a portion of each of the top electrode and the bottom electrode.

17. The method of claim 7, wherein the first sealing layer has a thickness of from about 10 angstroms to about 1,000 angstroms and comprises silicon nitride.

18. The method of claim 7, wherein the first sealing layer and the second sealing layer comprise a same material.

19. The method of claim 7, further comprising:
forming a further dielectric layer over the second sealing layer; and
forming a contact through the further dielectric layer to make contact with a top surface of the top electrode in a region where the top electrode is not overlaid by the phase change layer, wherein the contact is formed without removing the first and second sealing layers directly above the phase change layer.

* * * * *